United States Patent
Sadovnikov et al.

(10) Patent No.: US 12,501,633 B2
(45) Date of Patent: Dec. 16, 2025

(54) BREAKDOWN DIODES AND METHODS OF MAKING THE SAME

(71) Applicant: Texas Instruments Incorporated, Dallas, TX (US)

(72) Inventors: Alexei Sadovnikov, Sunnyvale, CA (US); Natalia Lavrovskaya, Sunnyvale, CA (US); Archana Venugopal, Mountain View, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 184 days.

(21) Appl. No.: 18/147,875

(22) Filed: Dec. 29, 2022

(65) Prior Publication Data

US 2024/0222527 A1     Jul. 4, 2024

(51) Int. Cl.
*H10D 8/25* (2025.01)
*H10D 8/01* (2025.01)
(Continued)

(52) U.S. Cl.
CPC ............ *H10D 8/25* (2025.01); *H10D 8/022* (2025.01); *H10D 62/114* (2025.01); *H10D 62/60* (2025.01)

(58) Field of Classification Search
CPC ............ H10D 8/20; H10D 8/25; H10D 8/021; H10D 8/022; H10D 8/041; H10D 8/043; H10D 8/045; H10D 8/411; H10D 8/422; H10D 62/10; H10D 62/103; H10D 62/105; H10D 62/107; H10D 62/111; H10D 62/113; H10D 62/114; H10D 62/124; H10D 62/125; H10D 62/126; H10D 62/128; H10D 62/129; H10D 62/60; H10D 64/112; H10D 64/20; H10D 64/64; H10D 64/667; H10D 64/668; H01L 27/0016; H01L 27/0296; H01L 27/0251; H01L 27/0255; H01L 27/0288; H01L 27/0705; H01L 27/0738; H01L 27/0802; H01L 27/0623; H01L 27/0635; H01L 27/0647; H01L 27/0652; H01L 27/0664; H01L 27/0676; H01L 27/0711; H01L 27/0727; H01L 27/075; H01L 27/0766; H01L 27/0783; H01L 27/0788; H01L 27/0266; H01L 29/0646;
(Continued)

(56) References Cited

U.S. PATENT DOCUMENTS

| 3,735,210 A * | 5/1973 | Kalish | H10D 99/00 257/605 |
| 2011/0175199 A1* | 7/2011 | Lin | H10D 62/114 257/605 |

(Continued)

OTHER PUBLICATIONS

"Internal Analysis Results," unpublished.

*Primary Examiner* — Natalia A Gondarenko
(74) *Attorney, Agent, or Firm* — Yudong Kim; Frank D. Cimino

(57) ABSTRACT

Breakdown diodes and methods of making the same are described. Such a breakdown diode can be fabricated in a semiconductor substrate and have a junction configured to breakdown under a target reverse bias applied across the junctions. The junction is located below the surface of the substrate by a distance suitable for ameliorating mechanical stress impact to the reverse bias breakdown voltage of the junction. Moreover, the junction is located away from an interface causing noise issues.

28 Claims, 8 Drawing Sheets

(51) Int. Cl.
*H10D 62/10* (2025.01)
*H10D 62/60* (2025.01)

(58) Field of Classification Search
CPC ............... H01L 29/36; H01L 29/4236; H01L 29/42352; H01L 29/66712; H01L 29/66734; H01L 29/66674; H01L 29/66113; H01L 29/66106; H01L 29/7808; H01L 29/7821; H01L 29/7801; H01L 29/7802; H01L 29/7834; H01L 29/866; H01L 2924/1207; H01L 2924/1306; H01L 2924/13091
USPC ....... 257/603, 173, 355, 551, 105, 106, 481, 257/601, 606, 328, E27.016
See application file for complete search history.

(56) References Cited

U.S. PATENT DOCUMENTS

| | | | | |
|---|---|---|---|---|
| 2013/0127007 A1* | 5/2013 | Chuang | ............... | H10D 89/931 |
| | | | | 257/E29.007 |
| 2022/0285564 A1* | 9/2022 | Mehrotra | ............. | H10D 62/129 |

\* cited by examiner

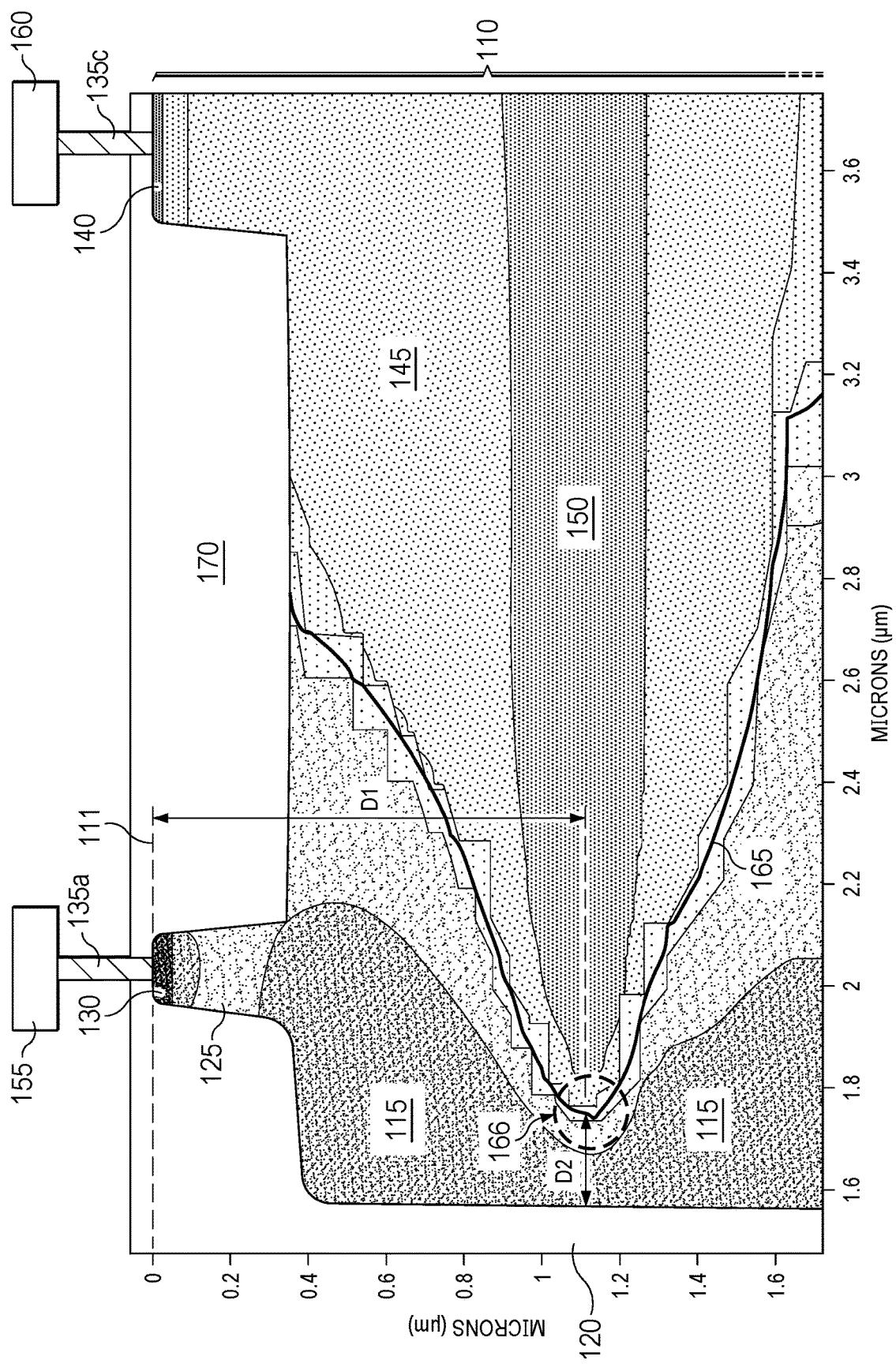

BREAKDOWN DIODES AND METHODS OF MAKING THE SAME

TECHNICAL FIELD

The present disclosure generally relates to the field of semiconductor devices, and more particularly to breakdown diodes and methods of making the same.

BACKGROUND

Voltage regulator circuits (or voltage reference circuits) typically include a breakdown diode that has a specified reverse bias breakdown voltage, i.e., the cathode of the diode being more positive than the anode of the diode, at which the diode begins to conduct current in a reverse direction, i.e., from the cathode to the anode direction. The current flowing through the breakdown diode at the reverse bias voltage can reach the maximum value of the circuit (usually limited by a series resistor of the circuit), and remains fairly constant over a wide range of reverse bias voltages. The reverse bias breakdown voltage may be designed to range from less than one volt to a few hundred volts. The point at which the reverse bias breakdown voltage triggers the current to flow through the breakdown diode needs to be controlled very accurately, in some applications, to less than 1% tolerance.

Long-term parameters of the breakdown diodes, including the reverse bias breakdown voltage, however, can vary over the lifetime of the breakdown diodes. In some cases, mechanical stress (e.g., stress generated from various structures above the substrate including the breakdown diodes, stress generated from packaging materials in the semiconductor assembly including the circuits) may cause drifts in the reverse bias breakdown voltages over time. Additionally, or alternatively, noise issue (e.g., random noise generated at various interfaces between different materials) may degrade long-term parameters of the breakdown diodes.

SUMMARY

The present disclosure describes breakdown diodes and methods of making the same. The breakdown diodes may be fabricated in a semiconductor substrate and have junctions at locations below a surface of the substrate by a distance equal to or greater than 1 micrometer. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

In some embodiments, a semiconductor device includes a substrate with a surface; a first electrode on the surface, the first electrode coupled to a p-doped region of the substrate; and a second electrode on the surface, the second electrode coupled to an n-doped region of the substrate, where the p-doped region and the n-doped region forms a pn junction located below the surface by a distance equal to or greater than 1 micron, the pn junction configured to breakdown under a target reverse bias across the pn junction.

In some embodiments, a method includes forming a deep n-well in a substrate with a surface, the deep n-well surrounding a p-doped region of the substrate; and forming a p-Zener portion of the p-doped region, where the p-Zener portion and the deep n-well forms a pn junction configured to breakdown under a target reverse bias across the pn junction.

In some embodiments, a method includes forming a mask defining an orifice over a substrate with a surface; adding p-type dopants in the substrate through the orifice, where the p-type dopants has a peak concentration at a first distance from the surface; adding n-type dopants in the substrate through the orifice, where the n-type dopants has a peak concentration at a second distance from the surface less than the first distance; and applying thermal energy to the substrate including the p-type and n-type dopants.

BRIEF DESCRIPTION OF THE DRAWINGS

For a more complete understanding of the present disclosure, reference is now made to the following descriptions taken in conjunction with the accompanying drawings, in which:

FIGS. 1A and 1B illustrate schematic diagrams of a semiconductor device in accordance with embodiments of the present disclosure;

DETAILED DESCRIPTION

Figure 1A:
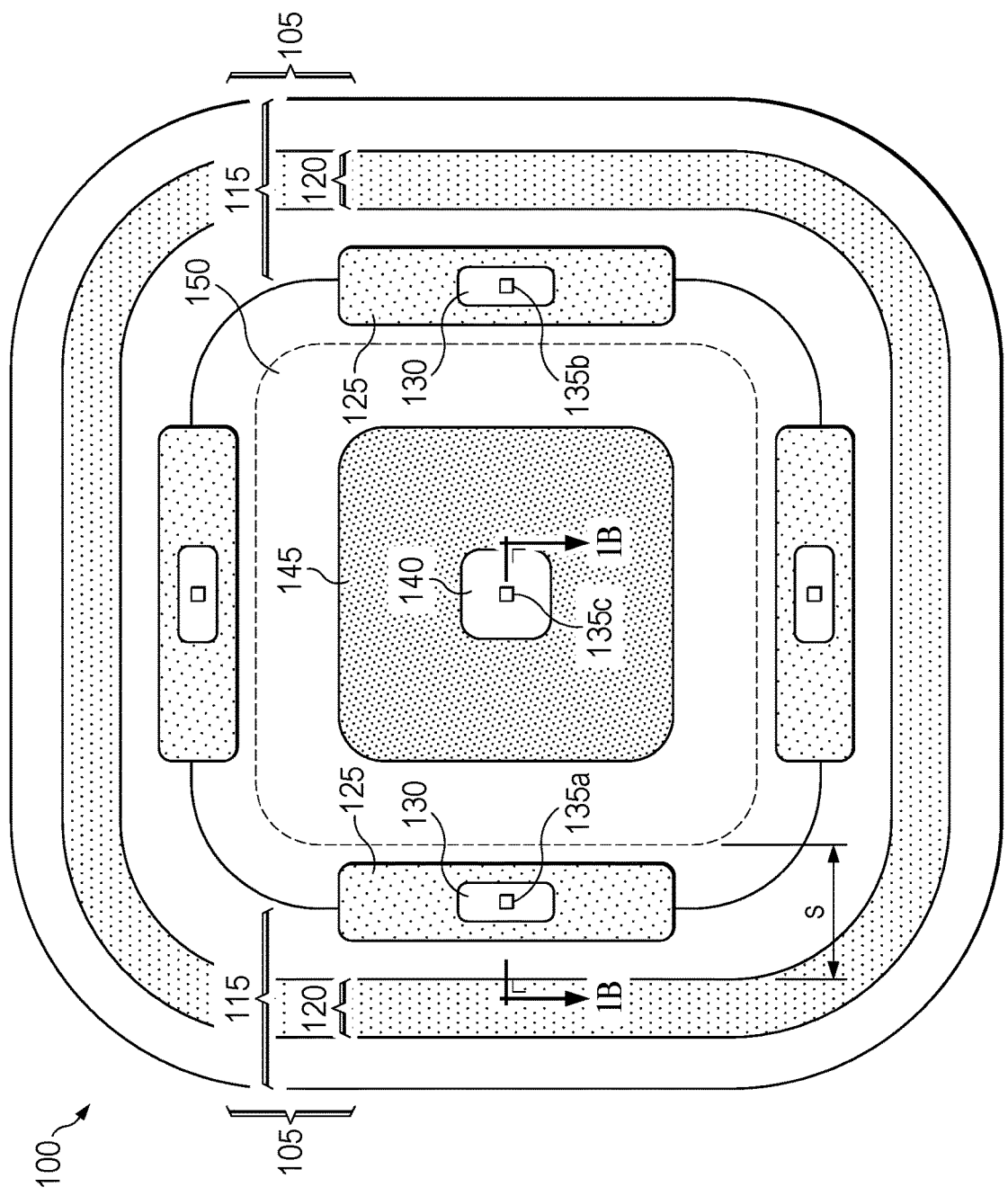

The present disclosure is described with reference to the attached figures. The components in the figures are not drawn to scale. Instead, emphasis is placed on clearly illustrating overall features and the principles of the present disclosure. Numerous specific details and relationships are set forth with reference to example embodiments of the figures to provide an understanding of the disclosure. Corresponding numerals and symbols in different figures generally refer to corresponding parts unless otherwise indicated. It is to be understood that the figures and examples are not meant to limit the scope of the present disclosure to such example embodiments, but other embodiments are possible by way of interchanging or modifying at least some of the described or illustrated elements. Moreover, where elements of the present disclosure can be partially or fully implemented using known components, those portions of such components that facilitate an understanding of the present disclosure are described, and detailed descriptions of other portions of such components are omitted so as not to obscure the disclosure.

Various structures disclosed herein can be formed using semiconductor process techniques. Layers including a variety of materials can be formed over a substrate, for example, using deposition techniques (e.g., chemical vapor deposition, physical vapor deposition, atomic layer deposition, spin coating, plating), thermal process techniques (e.g., oxidation, nitridation, epitaxy), and/or other suitable techniques. Similarly, some portions of the layers can be selectively removed, for example, using etching techniques (e.g., plasma (or dry) etching, wet etching), chemical mechanical planarization, and/or other suitable techniques, some of which may be combined with photolithography steps.

The semiconductor devices, integrated circuits (IC), or IC components described herein may be formed on a semiconductor substrate (or die) including various semiconductor materials, such as silicon, germanium, silicon-germanium alloy, gallium arsenide, gallium nitride, silicon carbide, or the like. In some cases, the substrate refers to a semiconductor wafer. The conductivity (or resistivity) of the substrate (or regions of the substrate) can be controlled by doping techniques using various chemical species (which may also be referred to as acceptor or donor dopant atoms) including, but not limited to, boron, indium, arsenic, or phosphorus. Doping may be performed during the initial formation or growth of the substrate (or an epitaxial layer grown on the substrate), by ion-implantation, or other suitable doping techniques. Regions or layers of the substrate doped with p-type dopant atoms (e.g., boron, indium, or other suitable acceptor dopant atoms) may be referred to as p-type (first conductivity type or p-doped) regions, layers, wells, or the like. Similarly, regions or layers of the substrate doped with n-type dopant atoms (e.g., phosphorus, arsenic, or other suitable donor dopant atoms) may be referred to as n-type (second conductivity type or n-doped) regions, layers, wells, or the like.

As used herein, terms such as "first" and "second" are used to arbitrarily distinguish between the elements such terms describe. Thus, these terms in the description and in the claims are not intended to indicate temporal or other prioritization of such elements. Moreover, terms such as "front," "back," "top," "bottom," "over," "under," "vertical," "horizontal," "lateral," "down," "up," "upper," "lower," or the like, are used to refer to relative directions or positions of features in the semiconductor devices in view of the orientation shown in the figures. For example, "upper" or "uppermost" can refer to a feature positioned closer to the top of a page than other features. It is to be understood that the terms so used are interchangeable under appropriate circumstances such that the embodiments of the technology described herein are, for example, capable of operation in other orientations than those illustrated or otherwise described herein. The term "approximately," as used herein, may refer to ±5% to ±10% variations of the recited values in some cases. In other cases, the term "approximately" may refer to ±10% to ±20% variations of the recited values.

The present disclosure describes breakdown diodes and methods of making the same. The breakdown diodes can be fabricated in a semiconductor substrate and have junctions configured to breakdown under target reverse bias voltages applied across the junctions. In other words, the junction can be devised to breakdown in response to a specified reverse bias voltage (a target reverse bias) applied across the junction. Such a specified reverse bias voltage may be referred to as a reverse bias breakdown voltage (Vbr) of the junction. Moreover, the junctions may be located below the surface of the substrate by a distance equal to or greater than 1 micrometer (μm, micron). The relatively deep junction depths of the breakdown diodes are expected to provide a suitable distance from the surface such that mechanical stress emanating from various structures above the substrate—e.g., interconnect layers and/or protection layers over the substrate, packaging materials used to generate semiconductor assemblies including the breakdown diodes— may not result in undesirable drift in the reverse bias breakdown voltage (Vbr) of the breakdown diodes during their operation. Moreover, the junctions are adequately distanced away from interfaces (e.g., Si/SiO$_2$ interface) that may trap electrons generated at the junctions when the reverse bias junction breakdown occurs. Random trapping of electrons (or de-trapping of electrons that have been trapped) at the interface may create noise issues for circuits including the breakdown diodes.

The breakdown diodes may be referred to as Zener diodes. The Vbr values of Zener diodes may be determined by relatively high electric field across the junction—e.g., a metallurgical junction at the interface between an n-doped region (cathode) and a p-doped region (anode). The breakdown phenomena can be attributed to impact ionization due to the high electric field, which increases quantity of charge carriers across the depletion region formed at the interface (i.e., pn junction). The electric field (thus the Vbr values) can be controlled by doping levels (dopant concentration or density) of the n-doped and p-doped regions that form the pn junction. As such, the n-doped region adjacent to the pn junction may be referred to as an n-Zener region. Similarly, the p-doped region adjacent to the pn junction may be referred to as a p-Zener region. In some embodiments, the Vbr values of Zener diodes may be devised to vary between approximately 6V to 9V. In such embodiments, the doping levels (or net doing concentration) of the n-Zener and p-Zener regions may be approximately in the order of $1 \times 10^{18}$ cm$^{-3}$ or greater.

When the n-Zener or p-Zener regions (which may be referred to as Zener regions) are located away from the surface (e.g., 1 μm or more below the surface), the Zener regions may be coupled to n-wells or p-wells located closer to the surface than the Zener regions. In some embodiments, the doping levels of the n-wells or p-wells may range between approximately $1 \times 10^{16}$ cm$^{-3}$ and $1 \times 10^{20}$ cm$^{-3}$. The n-wells or p-wells can couple the Zener regions (or deep n-wells) to n+ or p+ regions located at or near the surface. The n+ or p+ regions refer to relatively highly doped n-type or p-type regions formed proximate to the surface (or extended from the surface). In some embodiments, the doping levels of the n+ or p+ regions may be in the order of approximately $1 \times 10^{20}$ cm$^{-3}$ or greater. The n+ or p+ regions are coupled to electrodes (anode and cathode terminals)— e.g., contacts formed on or over the n+ or p+ regions and metal structures connected to the contacts. The p-wells and the n-wells between the Zener regions and the n+ and p+ regions may reduce parasitic resistance for the breakdown current conduction between the electrodes. In some embodiments, additional wells may be formed between the n-wells or p-wells and the n+ or p+ regions to further reduce the parasitic resistance.

FIGS. 1A and 1B illustrate schematic diagrams of a semiconductor device 100 (a breakdown diode 100) in accordance with embodiments of the present disclosure. FIG. 1A shows a plan view (which may be regarded as an example composite layout) of the semiconductor device 100; FIG. 1B shows a cross-sectional view of a portion of the semiconductor device 100 as marked in FIG. 1A. FIG. 1B also shows a two-dimensional (2D) profile of net doping density with a vertical axis corresponding to a vertical distance from a surface of a substrate and a horizontal axis corresponding to a lateral distance perpendicular to the vertical distance. These figures are described concurrently in the following discussion.

As shown in FIG. 1A, the semiconductor device 100 includes an isolation structure 105 that includes a deep n-well 115 and a deep trench (DT) isolation structure 120. In some embodiments, the DT isolation structure 120 (or DT structure 120) may be omitted from the isolation structure 105—i.e., the isolation structure 105 corresponding to the deep n-well 115. In some embodiments, the deep n-well 115 may reach down to a depth ranging between approximately 3 µm to 9 µm (i.e., the vertical distance from a surface 111 of the substrate 110), which is greater than distances that other doped regions may reach—e.g., n-wells, p-wells, n+ regions, or p+ regions, hence the name "deep" n-well. In some embodiments, a net doping density of the deep n-well 115 may be in the order of approximately $1 \times 10^{18}$ cm$^{-3}$ or greater. The DT structure 120 may extend into the substrate 110 at least as deep as the deep n-well 115, or even deeper, hence the name "deep" trench structure.

The deep n-well 115 is coupled to (or at least partially overlaps) n-wells 125. Each of the n-wells 125 includes an n+ region 130. The n+ regions 130, the n-wells 125, and the deep n-well 115 may be collectively referred to as an n-doped region of the semiconductor device 100. The n-doped region of the semiconductor device 100 is coupled to a first electrode 155 (first terminal, cathode terminal) through a contact 135 (e.g., contact 135a) formed on the surface 111 of the n+ region 130. In some embodiments, the contact (e.g., contact 135a) may be considered as part of the electrode (e.g., the first electrode 155). Although the semiconductor device 100 is depicted to include four n-wells 125, each including the n+ region 130, the present disclosure is not limited thereto. For example, the four n-wells 125 (and the four n+ regions 130) may be conjoined together to form a square band along the inner boundary of the deep n-well 115, which surrounds (encircles, circumscribes) a p+ region 140 of the semiconductor device 100.

The semiconductor device 100 includes a p-doped region that is surrounded (encircled, circumscribed) by the deep n-well 115, which includes the p+ region 140, a p-well 145, and a p-Zener region 150. The p-doped region is coupled to a second electrode 160 (second terminal, anode terminal) through another contact 135 (e.g., contact 135c) formed on or over the surface 111 of the p+ region 140. In some embodiments, the contact 135c may be considered as part of the second electrode 160.

Although FIG. 1A illustrates the semiconductor device 100 to have the p-Zener region 150 with a footprint greater than that of the p-well 145, the present disclosure is not limited thereto. As mentioned above, FIG. 1A may be an example composite layout of the semiconductor device 100. Accordingly, the footprints of the p-Zener region 150 and the p-well 145 shown in FIG. 1A may represent areas of the substrate 110, to which p-type dopant atoms are added–e.g., by ion implantation. As described in more detail herein with reference to FIG. 3, one or more process steps associated with thermal drives (e.g., heat cycles) are applied to the substrate 110 with various dopant atoms (e.g., boron, phosphorus, indium, arsenic) added thereto. In response to the thermal drives, the dopant atoms diffuse (spread out). Certain dopant atoms (e.g., phosphorus) may spread out more than others (e.g., boron). Also, certain dopant atoms (e.g., indium, arsenic) may not spread out as much—e.g., when compared to boron. As such, relative locations of the boundaries of the p-Zener region 150 and the p-well 145 may be varied from the layout of FIG. 1A in view of the dopant profiles before the thermal drives (e.g., as-implanted dopant profiles), dopant species, and the total thermal budget during the thermal drives.

Accordingly, in some embodiments, the footprint of the p-Zener region 150 may correspond to that of the p-well 145. In other embodiments, the footprint of the p-Zener region 150 may be within that of the p-well 145. Similarly, relative locations of the boundaries of the deep n-well 115, the n-well 125, and the n+ region 130 may be different than the layout of FIG. 1A. Although the layouts, process conditions, and sequences of process steps may vary within the scope of the present disclosure, the 2D profile of net doping density shown in FIG. 1B may be considered to illustrate the final dopant distribution of the semiconductor device 100— e.g., after all the process steps (e.g., ion implantation steps, thermal drive steps) are complete.

FIG. 1B shows a 2D profile of net doping density from a portion of the semiconductor device 100 as marked in FIG. 1A. Each section of the 2D profile between two contour lines may represent a portion of the substrate 110 having a range of certain net doping concentrations. Darker sections represent relatively greater net doping density when compared to lighter sections—e.g., within the n-doped region, within the p-doped region. The 2D profile of net doping density includes a junction 165 (which may be referred to as a metallurgical pn junction 165) between the n-doped region and the p-doped region of the semiconductor device 100. In this regard, the n-doped region corresponds to a first area of the substrate 110 generally left side of the junction 165. Similarly, the p-doped region corresponds to a second area of the substrate 110 generally right side of the junction 165. FIG. 1B also shows shallow trench isolation (STI) structure 170 that separates the n+ region 130 and the p+ region 140. In some embodiments, the STI structure 170 may be replaced with a local oxidation of silicon (LOCOS) structure or a silicide block structure of a dielectric material—e.g., silicide block structure 270 shown in FIG. 2B.

The n-doped region of the semiconductor device 100 includes the n+ region 130 coupled to the contact 135a that is connected to the first electrode 155. The contact 135a may be regarded as part of the first electrode 155. The n+ region 130 is coupled to the n-well 125 that is also coupled to the deep n-well 115. Accordingly, the deep n-well 115 is coupled to the n+ region 130 through the n-well 125. As described above, although not shown explicitly in FIG. 1B so as to illustrate other structures clearly, the deep n-well 115 may reach to depths of approximately 3 µm to 9 µm below the surface 111 of the substrate 110.

The deep n-well 115 may be formed by one or more ion implantation process steps after forming the deep trench of the DT structure 120. In other words, the ion implantation process steps may be performed on the sidewalls of the deep trench prior to filling the deep trench to complete the DT structure 120—e.g., forming a liner dielectric layer on the sidewalls and filling the deep trench with a poly-silicon layer on the liner dielectric layer. In some embodiments, the ion implantation process steps may include implanting phosphorus atoms at energies ranging from approximately 100 to 300 keV to doses ranging from approximately $1 \times 10^{15}$ cm$^{-2}$ to $3 \times 10^{15}$ cm$^{-2}$. Moreover, the implant steps may be done with tilt angles varying from approximately 10 to 20 degrees with respect to the normal axis of the surface 111. In some embodiments, the implant steps may include four-rotations to ensure adequate doping of all the sidewalls. As such, upon completing the thermal drive steps associated with fabricating the semiconductor device 100, the deep n-well may extend laterally from the sidewall of the DT structure 120. For example, at a vertical depth of about 1.7 µm, the 2D profile shows that the deep n-well laterally extends from the sidewall of the DT structure 120 to a horizontal distance of approximately 1.5 µm. As a result, the deep n-well 115 has a progressively decreasing concentration of n-type dopants (e.g., phosphorus) along horizontal directions (e.g., a direction in a plane parallel to the surface) from the sidewall of the DT structure 120.

The p-doped region of the semiconductor device 100 includes the p+ region 140 coupled to the contact 135c that is connected to the second electrode 160. The contact 135c may be regarded as part of the second electrode 160. The p+ region 140 is coupled to the p-well 145 that is also coupled to the p-Zener region 150. Accordingly, the p-Zener 150 is coupled to the p+ region 140 through the p-well 145.

The p-Zener region 150 may be formed by one or more ion implantation process steps after forming the DT structure 120 (and the STI structure 170 in some cases). In some embodiments, the ion implantation process steps may include implanting boron atoms at energies ranging from approximately 400 to 800 keV to doses ranging from approximately $1 \times 10^{14}$ cm$^{-2}$ to $1 \times 10^{15}$ cm$^{-2}$. Moreover, the implant steps may be done with a tilt angle of approximately 2 degrees with respect to the normal axis of the surface 111. In some embodiments, a thermal cycle (e.g., thermal drive at step 327 of FIG. 3) can be applied after implanting the dopant atoms to form the p-Zener region 150—e.g., to electrically activate and spread the dopant atoms. In other embodiments, a thermal cycle (e.g., thermal drive at step 327 of FIG. 3) can be applied before implanting the dopant atoms that form the p-Zener region 150. In such embodiments, the dopant atoms may be electrically activated and spread out (diffuse) during one or more thermal cycles following the implantation steps.

As described above, the 2D profile of net doping density of FIG. 1B may be regarded as the final dopant distribution—e.g., after all the thermal drive cycles are completed for the semiconductor device 100. The 2D profile shows that the p-Zener region 150 has a peak concentration at about 1.1 μm below the surface 111. Moreover, the p-Zener region 150 protrudes outward (e.g., toward the DT structure 120) at or near the location with the peak concentration (e.g., peak dopant concentration location) such that the pn junction 165 encroaches closer to the DT structure 120.

As the deep n-well 115 has higher dopant (e.g., phosphorus) concentrations at locations nearer to the DT structure 120 (and in view of the p-Zener region having the peak boron concentration), the pn junction 165 is expected to have a relatively lower breakdown voltage at a portion indicated by the circle 166 when compared to the other part of the pn junction 165. In other words, the portion of the pn junction 165 within the circle 166 corresponds to the location where impact ionization is likely to initiate at a target reverse bias voltage (or a target reverse bias) applied across the pn junction 165. As such, the portion of the pn junction 165 within the circle 166 may be referred to as a breakdown region of the pn junction 165. Moreover, the breakdown region corresponds to a circumference of the p-Zener region 150—e.g., at a vertical distance of approximately 1.1 μm from the surface 111 where the p-Zener region has its peak dopant concentration.

The depth of the breakdown region from the surface 111 (distance D1 denoted in FIG. 1B) can be increased or decreased by increasing or decreasing the implant energy of the p-Zener implant conditions (e.g., the boron implant energy). Moreover, the breakdown region is shown to be located away from the DT structure 120 by approximately 0.2 μm (distance D2 denoted in FIG. 1B). In other words, the breakdown region is away from the sidewall of the DT structure 120, where an interface between the silicon (e.g., the substrate 110) and the liner oxide (SiO$_2$) is formed. The distance D2 can be modified based on the space (S as denoted in FIG. 1A) between the DT structure 120 and the boundary of the p-Zener region 150. As the space S increases, the p-Zener region 150 encroaches less into the deep n-well 115, and the Vbr is expected to increase. In some embodiments, the space S may vary between approximately 0.3 μm to 0.5 μm, which may result in Vbr values ranging between approximately 7V to 9V.

The semiconductor device 100 is expected to be less prone to undesirable stress impact to its Vbr values in view of the relatively deep breakdown region when compared to breakdown diodes having relatively shallow breakdown regions—e.g., less than 1 μm below the surface. Moreover, in view of the breakdown region being spaced apart from a Si/SiO$_2$ interface (e.g., the interface between the DT structure 120 and the substrate 110) by at least 0.2 μm, the semiconductor device 100 is expected to exhibit less noise issues when compared to breakdown diodes having breakdown regions located closer to the Si/SiO$_2$ interfaces—e.g., less than 0.2 μm away therefrom.

Figure 2A:
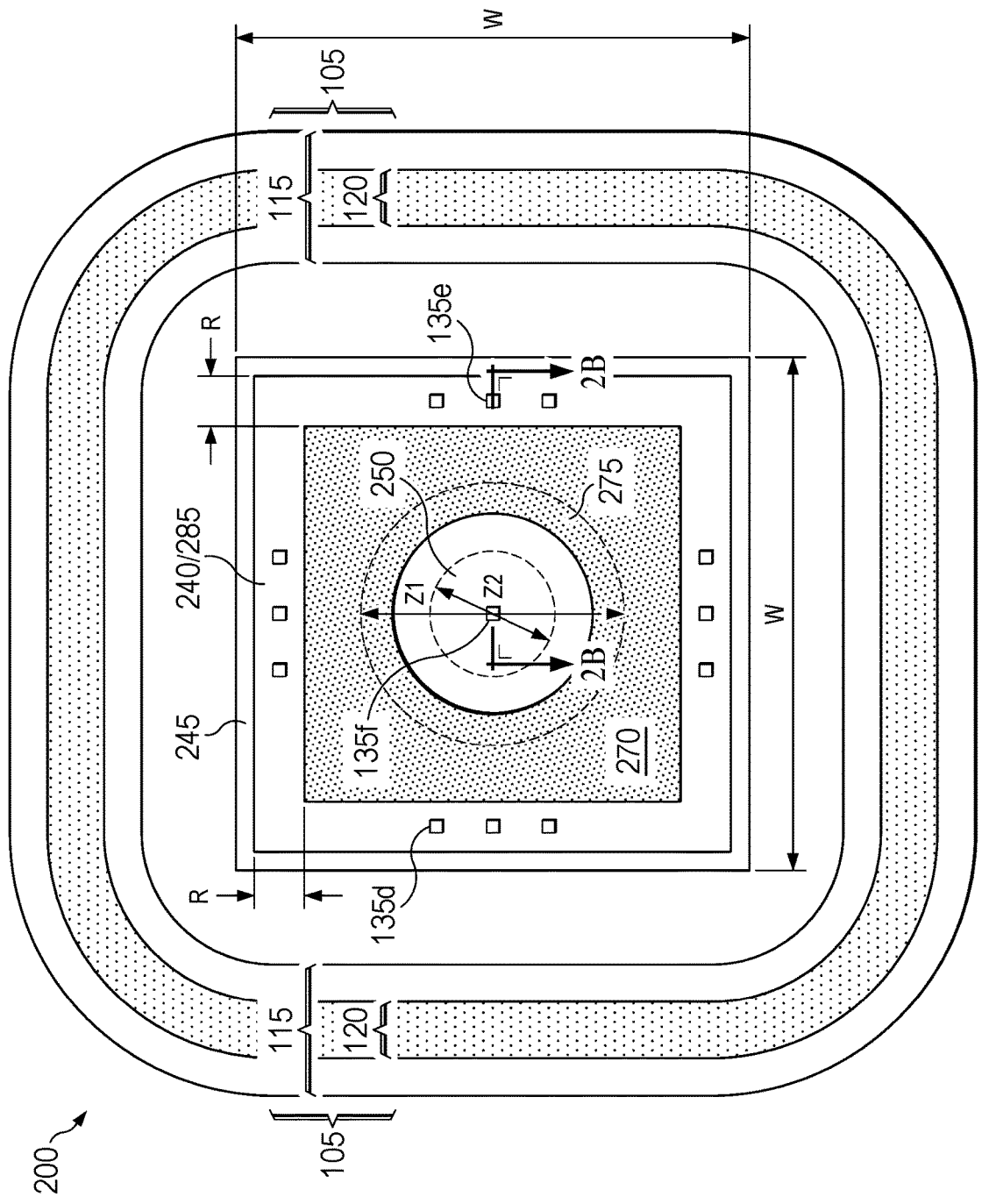
FIGS. 2A and 2B illustrate schematic diagrams of a semiconductor device in accordance with embodiments of the present disclosure.
Figure 2B:
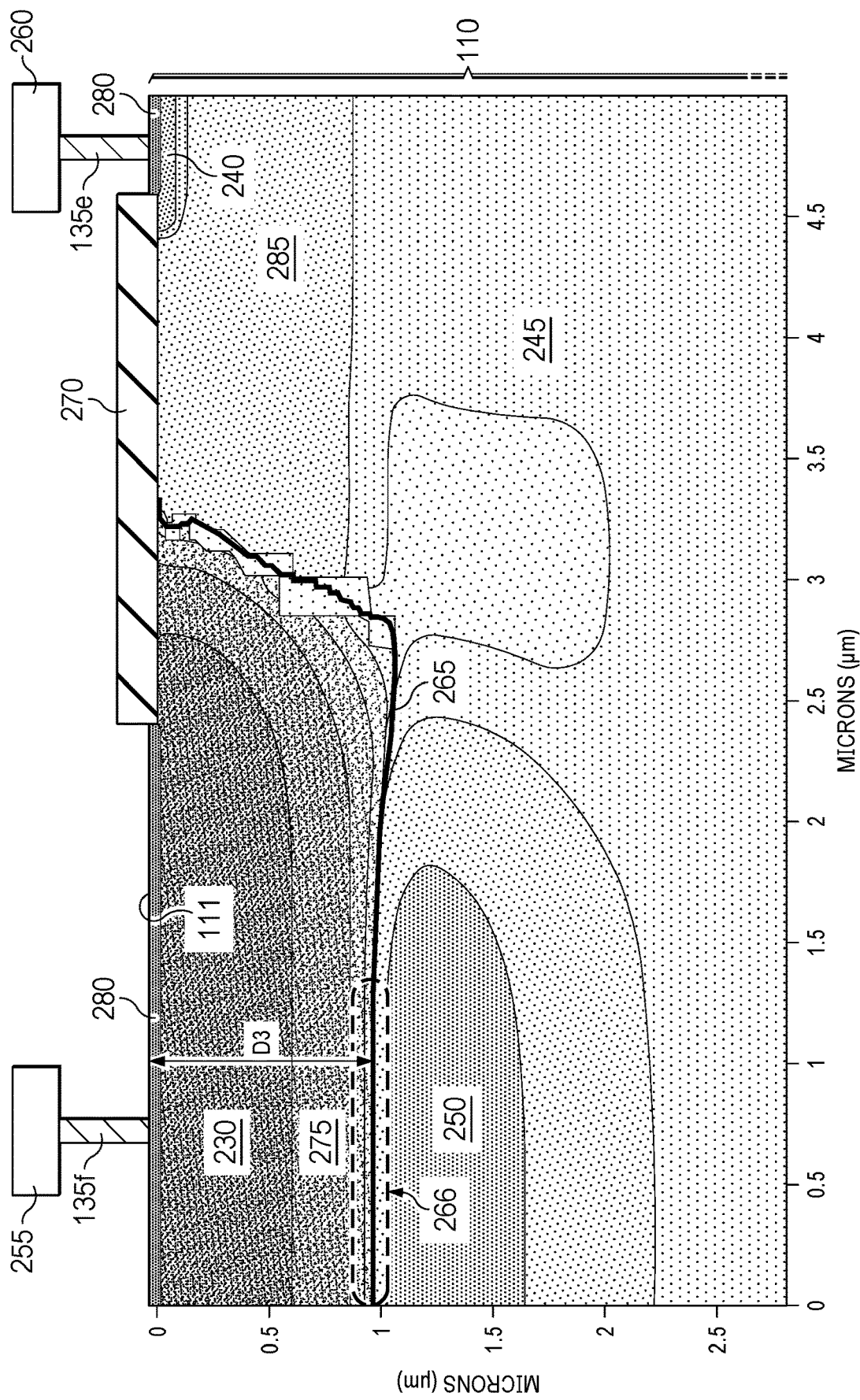

FIGS. 2A and 2B illustrate schematic diagrams of a semiconductor device 200 (a breakdown diode 200) in accordance with embodiments of the present disclosure. FIG. 2A shows a plan view (which may be regarded as an example composite layout) of the semiconductor device 200; FIG. 2B shows a cross-sectional view of a portion of the semiconductor device 200 as marked in FIG. 2A. FIG. 2B also shows a 2D profile of net doping density with a vertical axis corresponding to a vertical distance from a surface of a substrate and a horizontal axis corresponding to a lateral distance perpendicular to the vertical distance. These figures are described concurrently in the following discussion.

As shown in FIG. 2A, the semiconductor device 200 may include an isolation structure—e.g., the isolation structure 105 including the deep n-well 115 and the DT structure 120. In some embodiments, the DT structure 120 may be omitted from the isolation structure 105. In some embodiments, the semiconductor device 200 may not include the isolation structure. In other embodiments, the semiconductor device 200 may include a different isolation structure (e.g., LOCOS isolation, STI isolation) in lieu of the isolation structure 105 shown in FIG. 2A.

The semiconductor device 200 includes an n-doped region that has an n+ region 230 and an n-Zener region 275. The n+ region 230 may include aspects of the n+ region 130 described with reference to FIGS. 1A and 1B—e.g., dopant density and profile. The n+ region 230 is coupled to a contact (e.g., contact 135$f$) that is connected to a first electrode 255 as shown in FIG. 2B. The contact 135$f$ may be regarded as part of the first electrode 255. The n+ region 230 is coupled to the n-Zener region 275. In this regard, a footprint of the n-Zener region 275 includes a footprint of the n+ region 230. In some embodiments, a net doping density of the n-Zener region 275 may be in the order of approximately $1 \times 10^{18}$ cm$^{-3}$ or greater.

In some embodiments, the n-Zener region 275 may be formed by one or more ion implantation process steps after forming the DT structure 120 (and the STI structure 170 in some cases). For example, the one or more ion implantation process steps can be done with a resist mask defining an opening with a diameter Z1 as denoted in FIG. 2A. In some embodiments, the ion implantation process steps may include implanting phosphorus atoms at energies ranging from approximately 10 to 100 keV to doses ranging from approximately $1 \times 10^{14}$ cm$^{-2}$ to $1 \times 10^{16}$ cm$^{-2}$. Moreover, the implant steps may be done with a tilt angle of approximately 2 degrees with respect to the normal axis of the surface 111. Subsequently, a thermal cycle (e.g., thermal drive at step 345, 360, or 370 of FIG. 3) can be applied to the substrate 110 to form the n-Zener region 275—e.g., to electrically activate and spread out the dopant atoms.

The semiconductor device 200 also includes a p-doped region that has a p+ region 240, a p-well 245, and a p-Zener region 250. The p+ region 240 may include aspects of the p+ region 140 described with reference to FIGS. 1A and 1B—e.g., dopant density and profile. As shown in FIG. 2A, the p+ region 240 may have a footprint of a width R, which surrounds the footprint of the n-Zener region 275 (that includes a footprint of the p-Zener region 250). As such, the footprint of the p+ region 240 may be of a square band shape surrounding the footprint of the n-Zener region 275. The p-well 245 may have a footprint of a square shape with a width W, which includes the footprint of the p+ region 240. The p-well 245 may include aspects of the p-well 145 described with reference to FIGS. 1A and 1B—e.g., dopant density and profile. The p+ region 240 is coupled to contacts (e.g., contacts 135d/e) that are connected to a second electrode 260 as shown in FIG. 2B. The contacts 135d/e may be regarded as part of the second electrode 260. The p+ region 240 is coupled to the p-well 245 that is also coupled to the p-Zener region 250. Accordingly, the p-Zener region 250 is coupled to the p+ region 240 through the p-well 245.

In some embodiments, the semiconductor device 200 includes an additional p-well 285. The additional p-well 285 may have the same footprint as the p+ region 240. Moreover, the additional p-well 285 may have a greater net doping density than the p-well 245 and may be located between the p+ region 240 and the p-well 245 as depicted in FIG. 2B. As such, the p-Zener region 250 may be coupled to the p+ region 240 through the p-well 245 and the additional p-well 285. In this manner, the additional p-well 285 may reduce the parasitic resistance for the breakdown current conduction between the electrodes 255 and 260.

The p-Zener region 250 may be formed by one of more ion implantation process steps. In some embodiments, the implant process steps may include implanting boron atoms at energies ranging from approximately 400 to 800 keV to doses ranging from approximately $1 \times 10^{14}$ cm$^{-2}$ to $1 \times 10^{15}$ cm$^{-2}$. Moreover, the implant steps may be done with a tilt angle of approximately 2 degrees with respect to the normal axis of the surface 111. As described in more details herein with reference to FIG. 3, the ion implantation process steps forming the p-Zener region 250 may be carried out in various ways. For example, the ion implantation process steps forming the p-Zener region 250 can be carried out together with the ion implantation process steps forming the n-Zener region 275 using the same mask (Flow 2a described in FIG. 3). Alternatively, as in Flow 2b or 2c described in FIG. 3, the ion implantation process steps forming the p-Zener region 250 may be carried out with its own mask— e.g., a resist mask defining an opening with a diameter Z2 as denoted in FIG. 2A. Moreover, when the ion implantation process steps forming the p-Zener region 250 is carried out with its own mask, the implantation process steps may be done before a thermal drive (Flow 2b) or after a thermal drive (Flow 2c). Although the process sequences and conditions for forming the p-Zener region 250 may vary within the scope of the present disclosure, the 2D profile of net doping density shown in FIG. 2B may be regarded as the final dopant distribution of the semiconductor device 200— e.g., after all the process steps (e.g., ion implantation steps, thermal drive steps) are complete. The 2D profile of net doping density shown in FIG. 2B is generally applicable to the flow options Flow 2a through 2c described with reference to FIG. 3.

Although FIG. 2A illustrates the semiconductor device 200 to have the n-Zener region 275 with a footprint greater than that of the p-Zener region 250, the present disclosure is not limited thereto. As mentioned above, FIG. 2A may be an example composite layout of the semiconductor device 200. Accordingly, the footprints of the n-Zener region 275 and the p-Zener region 250 shown in FIG. 2A may represent areas of the substrate 110, to which n-type and p-type dopant atoms are added, respectively—e.g., by ion implantation. As described in more detail herein with reference to FIG. 3, one or more process steps associated with thermal drives (e.g., heat cycles) are applied to the substrate 110 with various dopant atoms (e.g., boron, phosphorus, indium, arsenic) added thereto. In response to the thermal drives, the dopant atoms diffuse (spread out), and different dopant atoms may spread out more or less than others as explained above. As such, relative locations of the boundaries of the n-Zener region 275 and the p-Zener region 250 may be varied from the layout of FIG. 2A in view of the dopant profiles before the thermal drives (e.g., as-implanted dopant profiles), dopant species, and the total thermal budget during the thermal drives.

Accordingly, in some embodiments, the footprint of the n-Zener region 275 may correspond to that of the p-Zener region 250 (i.e., Z1 being equal to Z2). In other embodiments, the footprint of the n-Zener region 275 may be within that of the p-Zener region 250 (i.e., Z1 being less than Z2). Although the layouts, process conditions, and sequences of process steps may vary within the scope of the present disclosure, the 2D profile of net doping density shown in FIG. 2B may be considered to illustrate the final dopant distribution of the semiconductor device 200—e.g., after all the process steps (e.g., ion implantation steps, thermal drive steps) are complete.

FIG. 2B shows a 2D profile of net doping density from a portion of the semiconductor device 200 as marked in FIG. 2A. Each section of the 2D profile between two contour lines may represent a portion of the substrate 110 having a range of certain net doping concentrations. Darker sections represent relatively greater net doping density when compared to lighter sections—e.g., within the n-doped region, within the p-doped region. The 2D profile of net doping density includes a junction 265 (which may be referred to as a metallurgical pn junction 265) between the n-dope region and the p-doped region of the semiconductor device 200. In this regard, the n-doped region corresponds to a first area of the substrate 110, which is generally located in the upper-left side of the junction 265. The p-doped region corresponds to the remaining area of the substrate 110 depicted in FIG. 2B. Also shown in FIG. 2B is a silicide-block structure 270 that separates the n+ region 230 and the p+ region 240, as well as silicide structures 280 formed on the n+ region 230 and the p+ region 240, respectively. In some embodiments, the silicide-block structure 270 may be replaced with a LOCOS structure or an STI structure—e.g., STI structure 170 shown in FIG. 1B.

The 2D profile of FIG. 2B shows that the p-Zener region 250 has a peak concentration at about 1.4 µm below the surface 111. Moreover, the p-Zener region 250 and the n-Zener region 275 forms a portion of the pn junction 265 within the box 266 (depicted in FIG. 2B). The portion of the pn junction 265 within the box 266 is expected to have a relatively lower breakdown voltage when compared to the other part of the pn junction 265 in view of the doping density of the p-Zener region 250 and the n-Zener region 275, both of which are greater than the other part of the n-doped or p-doped region along the pn junction 265. In other words, the portion of the pn junction 265 within the box 266 corresponds to the location where impact ionization is likely to initiate at a target reverse bias voltage (or a target reverse bias) applied across the pn junction 265. As such, the portion of the pn junction 265 within the box 266 may be referred to as a breakdown region of the pn junction 265. The 2D profile of FIG. 2B also shows that the footprint of the n-Zener region 275 includes the footprint of the p-Zener region 250. Moreover, the footprint of the p-Zener region 250 includes the breakdown region of the pn junction 265.

The depth of the breakdown region (distance D3 from the surface 111 as denoted in FIG. 2B) and Vbr values of the semiconductor device 200 can be increased or decreased by increasing or decreasing the implant energy of the p-Zener implant and the n-Zener implant conditions in conjunction with the total thermal budget of the thermal drive cycles for fabricating the semiconductor device 200. The depth (D3) of the breakdown region of the semiconductor device 200 may be located below the surface 111 by a distance equal to or greater than 1 micron. In some embodiments, the Vbr values of the semiconductor device 200 ranges between approximately 6.5V to 8V.

The semiconductor device 200 is expected to be less prone to undesirable stress impact to its Vbr values in view of the relatively deep breakdown region (e.g., at approximately 1 μm or greater from the surface) when compared to breakdown diodes having relatively shallow breakdown regions—e.g., less than 1 μm deep from the surface. Moreover, in view of the breakdown region being away from the $Si/SiO_2$ interface (e.g., the interface between the silicide block 270 and the substrate 110) by the same amount, the semiconductor device 100 is expected to exhibit less noise issues when compared to breakdown diodes having breakdown regions located closer to the $Si/SiO_2$ interfaces—e.g., less than 0.2 μm away therefrom.

Figure 3:
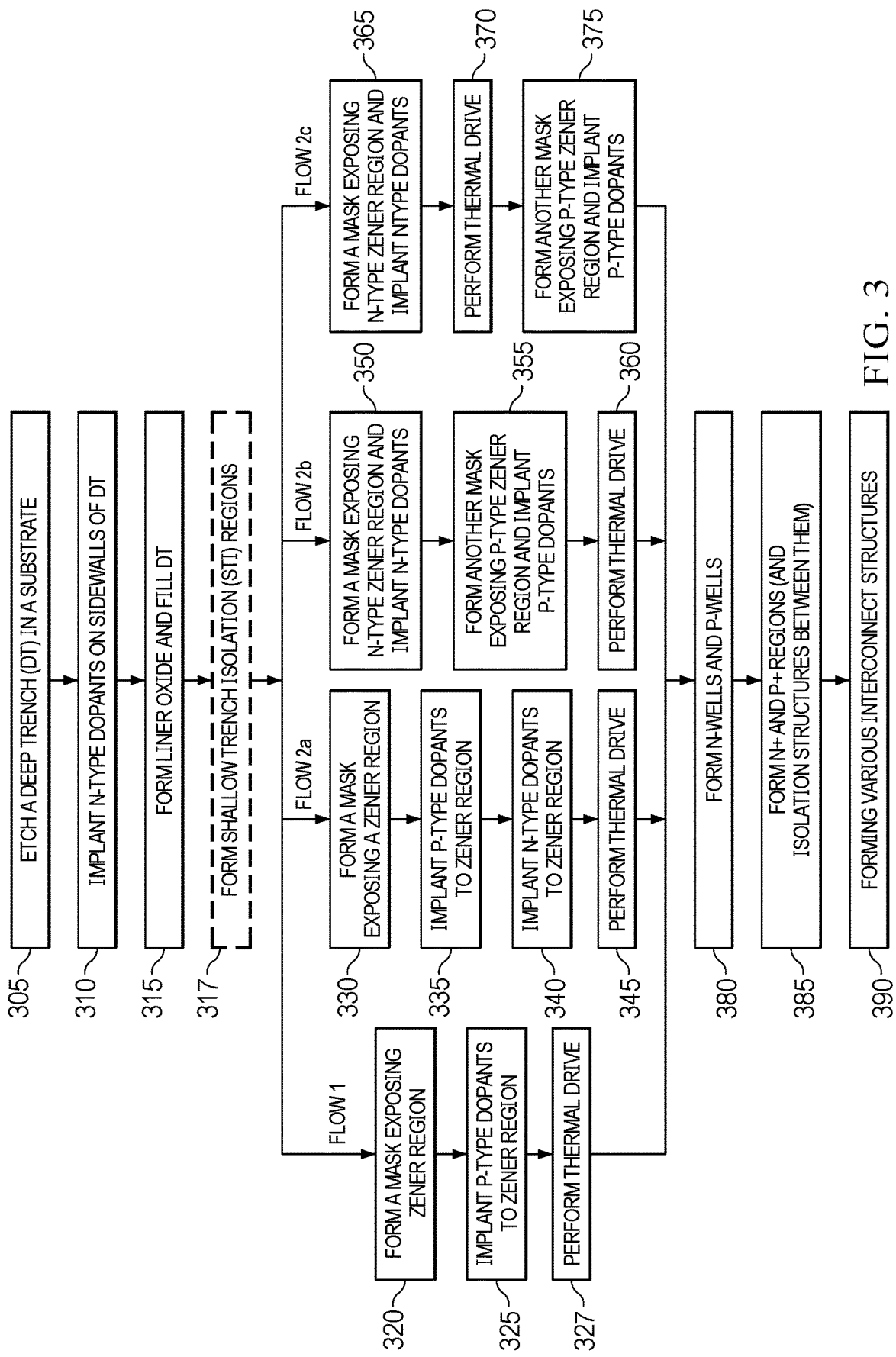
FIG. 3 describes process flow options to fabricate semiconductor devices in accordance with embodiments of the present disclosure.

FIG. 3 describes process flow options for fabricating semiconductor devices in accordance with embodiments of the present disclosure. More specifically, FIG. 3 describes Flow 1 that may be used to fabricate the semiconductor device 100 described with reference to FIGS. 1A and 1B. FIG. 3 also describes Flows 2a through 2c that may be used to fabricate the semiconductor device 200 described with reference to FIGS. 2A and 2B. Process steps 305 through 315 and steps 380 through 390 may be common to all flow options.

At step 305, a deep trench (DT) is formed in a substrate (e.g., substrate 110) to form a DT structure (e.g., DT structure 120). In some embodiments, the deep trench may extend to approximately 3 μm to 30 μm from a surface of the substrate (e.g., surface 111). In some embodiments, the substrate may be a p-type epitaxial layer formed on a semiconductor wafer. In some embodiments, the p-type epitaxial layer may be grown on an n-type layer formed on the semiconductor wafer.

At step 310, one or more ion implantation process steps are carried out to implant dopant atoms on sidewalls of the deep trench. In some embodiments, the ion implantation process steps may include implanting phosphorus atoms at energies ranging from approximately 100 to 300 keV to doses ranging from approximately $1\times10^{15}$ $cm^{-2}$ to $3\times10^{15}$ $cm^{-2}$. Moreover, the implant steps may be done with tilt angles varying from approximately 10 to 20 degrees with respect to the normal axis of the surface. In some embodiments, the implant steps may include four-rotations to ensure adequate doping of all the sidewalls.

At step 315, a liner oxide may be formed on the sidewalls. In some embodiments, the liner oxide may be thermally grown on the sidewalls. The liner oxide may have thicknesses ranging between approximately 0.1 μm to 0.8 μm. Additionally, the deep trench is filled with a poly-silicon layer. At step 317, STI structures (e.g., STI structure 170) may be formed if the semiconductor devices (e.g., semiconductor device 100) include STI structures. If the semiconductor devices (e.g., semiconductor device 200) do not include STI structures, the step 317 is omitted.

Flow 1 includes steps 320, 325, and 327. At step 320, a mask (e.g., a photoresist mask) may be formed to expose the p-Zener region (e.g., p-Zener region 150)—e.g., forming an orifice in a photoresist layer, thereby exposing the p-Zener region while covering other regions of the substrate. The boundary of the p-Zener region may be spaced away from the DT structure (e.g., DT structure 120) by approximately 0.3 to 0.5 μm as indicated by the space S denoted in FIG. 1A. In some embodiments, the orifice may be at least 3.5 μm wide or greater—e.g., to avoid depleting the p-Zener region.

At step 325, one or more ion implantation process steps are carried out using the mask exposing the p-Zener region. In some embodiments, the implant process steps may include implanting boron atoms at energies ranging from approximately 400 to 800 keV to doses ranging from approximately $1\times10^{14}$ $cm^{-2}$ to $1\times10^{15}$ $cm^{-2}$. Moreover, the implant steps may be done with a tilt angle of approximately 2 degrees with respect to the normal axis of the surface 111.

At step 327, one or more thermal drive cycles are carried out to the substrate. In some embodiments, the thermal drive cycles may substantially correspond to a thermal budget of a LOCOS process module. Although FIG. 3 shows that the thermal drive cycles at step 327 follow the p-Zener implant process at step 325, in some embodiments, the p-Zener implant process at step 325 may be carried out after the thermal drive cycles at step 327.

Flow 2a includes steps 330, 335, 340, and 345. At step 330, a mask (e.g., photoresist mask) may be formed to expose a p-Zener region (e.g., p-Zener region 250 shown in FIG. 2A)—e.g., forming an orifice in the photoresist exposing the p-Zener region while covering other regions of the substrate. The orifice may have a diameter Z2 as shown in FIG. 2a. In some embodiments, the orifice may be at least 3.5 μm wide or greater—e.g., Z2 being at least 3.5 μm or greater to avoid depleting the p-Zener region.

At step 335, one or more ion implantation process steps are carried out using the mask exposing the p-Zener region (e.g., p-Zener region 250). In some embodiments, the implant process steps may include implanting boron atoms at energies ranging from approximately 400 to 800 keV to doses ranging from approximately $1\times10^{14}$ $cm^{-2}$ to $1\times10^{15}$ $cm^{-2}$. Moreover, the implant steps may be done with a tilt angle of approximately 2 degrees with respect to the normal axis of the surface (e.g., surface 111).

At step 340, one or more ion implantation process steps are carried out using the same mask used for implanting the p-Zener region (e.g., p-Zener region 250). In some embodiments, the implant process steps may include implanting phosphorus atoms at energies ranging from approximately 10 to 100 keV to doses ranging from approximately $1\times10^{14}$ $cm^{-2}$ to $1\times10^{16}$ $cm^{-2}$. Moreover, the implant steps may be done with a tilt angle of approximately 2 degrees with respect to the normal axis of the surface 111. As the p-Zener boron implantation and the n-Zener phosphorus implantation are carried out with the same mask (e.g., the photoresist mask with the orifice having the diameter of Z2 depicted in FIG. 2A), the as-implanted profiles of boron and phosphorus atoms may have comparable lateral distribution although the boron as-implanted profile is expected to be located deeper into the substrate than the phosphorus as-implanted profile—e.g., based on the implantation energy used to implant boron and phosphorus, respectively.

At step 345, one or more thermal drive cycles are carried out to the substrate including the boron atoms for forming the p-Zener region and the phosphorus atoms for forming the n-Zener region. In some embodiments, the thermal drive cycles may substantially correspond to a thermal budget of a LOCOS process module. During the thermal drive cycles, the boron atoms for the p-Zener region and the phosphorus atoms for the n-Zener region diffuse (spread out) in response to the thermal energy applied by the thermal drive cycles. In view of phosphorus atoms having greater diffusivity than that of boron atoms, the diffusion front of the phosphorus atoms is expected to move farther in the lateral direction (i.e., the horizontal direction as shown in FIG. 2B) than the diffusion front of the boron atoms. In this manner, the footprint of the n-Zener region 275 can include the footprint of the p-Zener region 150 as shown in FIG. 2B.

Flow 2b includes steps 350, 355, and 360. At step 350, a mask (e.g., photoresist mask) may be formed to expose an n-Zener region (e.g., n-Zener region 275 shown in FIG. 2A)—e.g., forming an orifice in the photoresist exposing the n-Zener region while covering other regions. The orifice may have a diameter Z1 as shown in FIG. 2A. Moreover, one or more implant process steps can be carried out using the mask exposing the n-Zener region. In some embodiments, the implant process steps includes implanting phosphorus atoms at energies ranging from approximately 10 to 100 keV to doses ranging from approximately $1 \times 10^{14}$ $cm^{-2}$ to $1 \times 10^{16}$ $cm^{-2}$. Moreover, the implant steps may be done with a tilt angle of approximately 2 degrees with respect to the normal axis of the surface.

At step 355, another mask (e.g., photoresist mask) may be formed to expose a p-Zener region (e.g., p-Zener region 250 shown in FIG. 2A)—e.g., forming an orifice in the photoresist exposing the p-Zener region while covering other regions. The orifice may have a diameter Z2 as shown in FIG. 2A. In some embodiments, the diameter Z2 may be at least 3.5 μm wide or greater—e.g., to avoid depleting the p-Zener region. The diameter Z1 may be greater than Z2 by approximately 0.6 μm or more. In this manner, the footprint of the n-Zener region is ensured to include the footprint of the p-Zener region. Subsequently, one or more implant process steps can be carried out using the mask exposing the p-Zener region. In some embodiments, the implant process steps includes include implanting boron atoms at energies ranging from approximately 400 to 800 keV to doses ranging from approximately $1 \times 10^{14}$ $cm^{-2}$ to $1 \times 10^{15}$ $cm^{-2}$. Moreover, the implant steps may be done with a tilt angle of approximately 2 degrees with respect to the normal axis of the surface.

At step 360, one or more thermal drive cycles are carried out to the substrate including the boron atoms for forming the p-Zener region and the phosphorus atoms for forming the n-Zener region. In some embodiments, the thermal drive cycles may substantially correspond to a thermal budget of a LOCOS process module.

Flow 2c includes steps 365, 370, and 375. At step 365, a mask (e.g., photoresist mask) may be formed to expose an n-Zener region (e.g., n-Zener region 275 shown in FIG. 2A)—e.g., forming an orifice in the photoresist exposing the n-Zener region while covering other regions of the substrate. The orifice may have a diameter Z1 as shown in FIG. 2A. Moreover, one or more implant process steps can be carried out using the mask exposing the n-Zener region. In some embodiments, the implant process steps includes implanting phosphorus atoms at energies ranging from approximately 10 to 100 keV to doses ranging from approximately $1 \times 10^{14}$ $cm^{-2}$ to $1 \times 10^{16}$ $cm^{-2}$. Moreover, the implant steps ay be done with a tilt angle of approximately 2 degrees with respect to the normal axis of the surface.

At step 370, one or more thermal drive cycles are carried out to the substrate including the phosphorus atoms for forming the n-Zener region. In some embodiments, the thermal drive cycles may substantially correspond to a thermal budget of a LOCOS process module.

At step 375, another mask (e.g., photoresist mask) may be formed to expose a p-Zener region (e.g., p-Zener region 250 shown in FIG. 2A)—e.g., forming an orifice in the photoresist exposing the p-Zener region while covering other regions of the substrate. The orifice may have a diameter Z2 as shown in FIG. 2A. In some embodiments, the diameter Z2 may be at least 3.5 μm wide or greater—e.g., to avoid depleting the p-Zener region. The diameter Z1 may be greater than Z2 by approximately 0.6 μm or more. In this manner, the footprint of the n-Zener region is ensured to include the footprint of the p-Zener region. Subsequently, one or more implant process steps can be carried out using the mask exposing the p-Zener region. In some embodiments, the implant process steps includes include implanting boron atoms at energies ranging from approximately 400 to 800 keV to doses ranging from approximately $1 \times 10^{14}$ $cm^{-2}$ to $1 \times 10^{15}$ $cm^{-2}$. Moreover, the implant steps may be done with a tilt angle of approximately 2 degrees with respect to the normal axis of the surface. The boron atoms for forming the p-Zener region may be activated (and spread out) during subsequent thermal cycles.

Flow 1 and Flows 2a-2c may continue to steps 380, 385, and 390. At step 380, n-wells (e.g., n-well 125) and p-wells (e.g., p-well 145 or 245) may be formed. At step 385, n+ regions (e.g., n+ regions 130 or 230) and p+ regions (e.g., p+ regions 140 or 240) may be formed. Additionally, isolation structures between the n+ regions and p+ regions—e.g., silicide block 270— may be formed. At step 390, various interconnect structures (e.g., contacts 135, electrodes 155, 160, 255, or 260) may be formed.

Figure 4A:
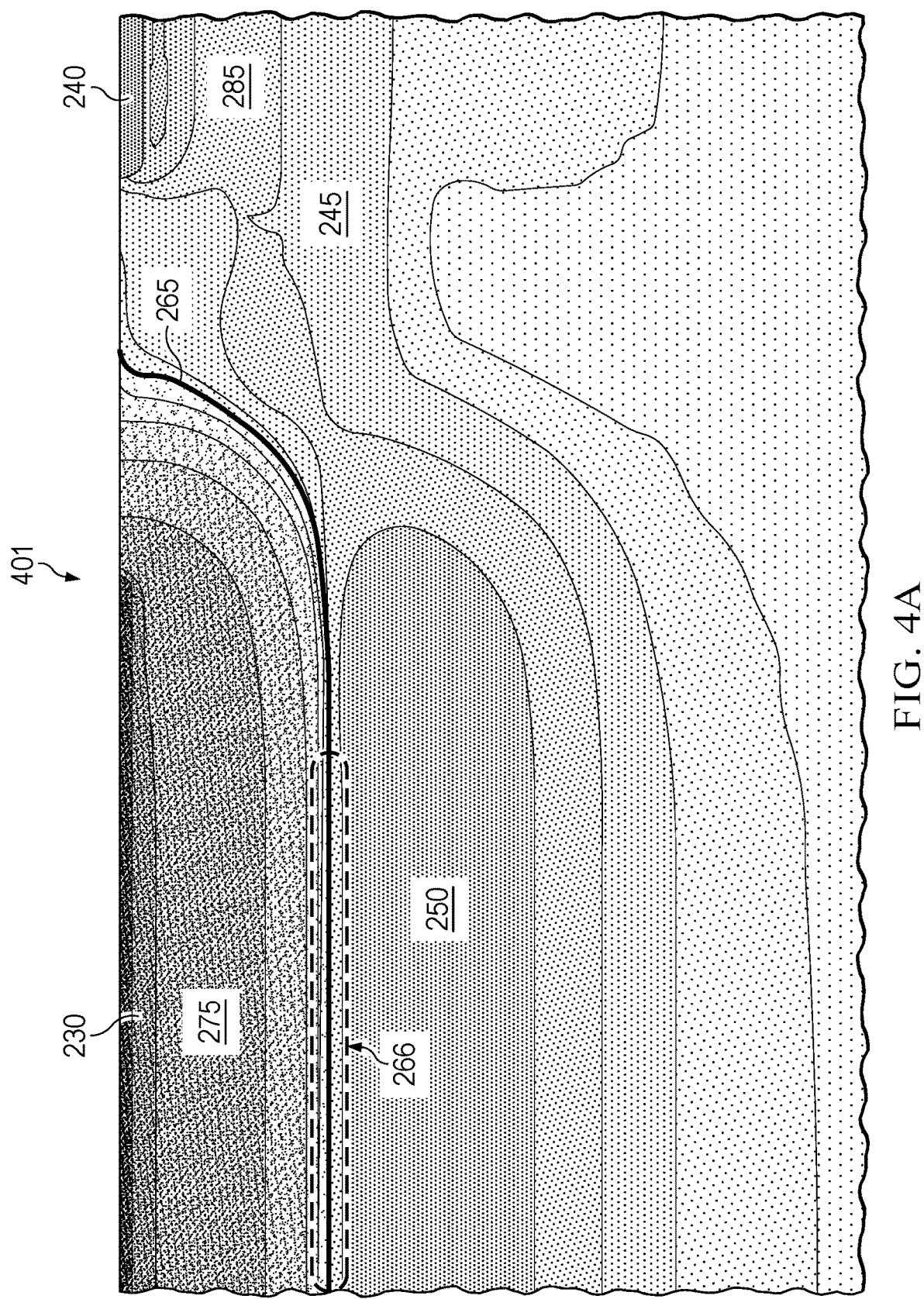
FIGS. 4A through 4C illustrate schematic two-dimensional diagrams of semiconductor devices in accordance with embodiments of the present disclosure.
Figure 4B:
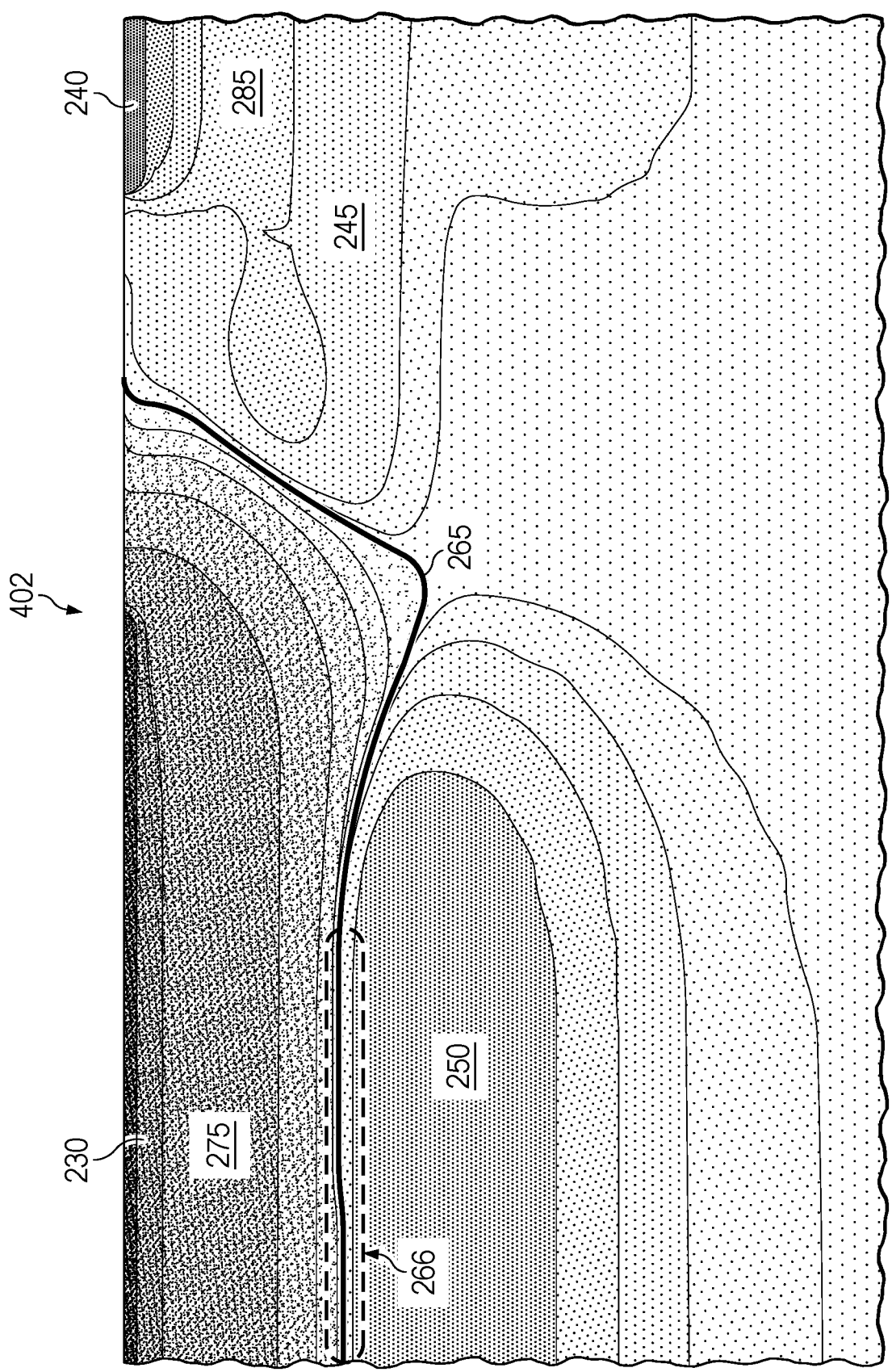
Figure 4C:
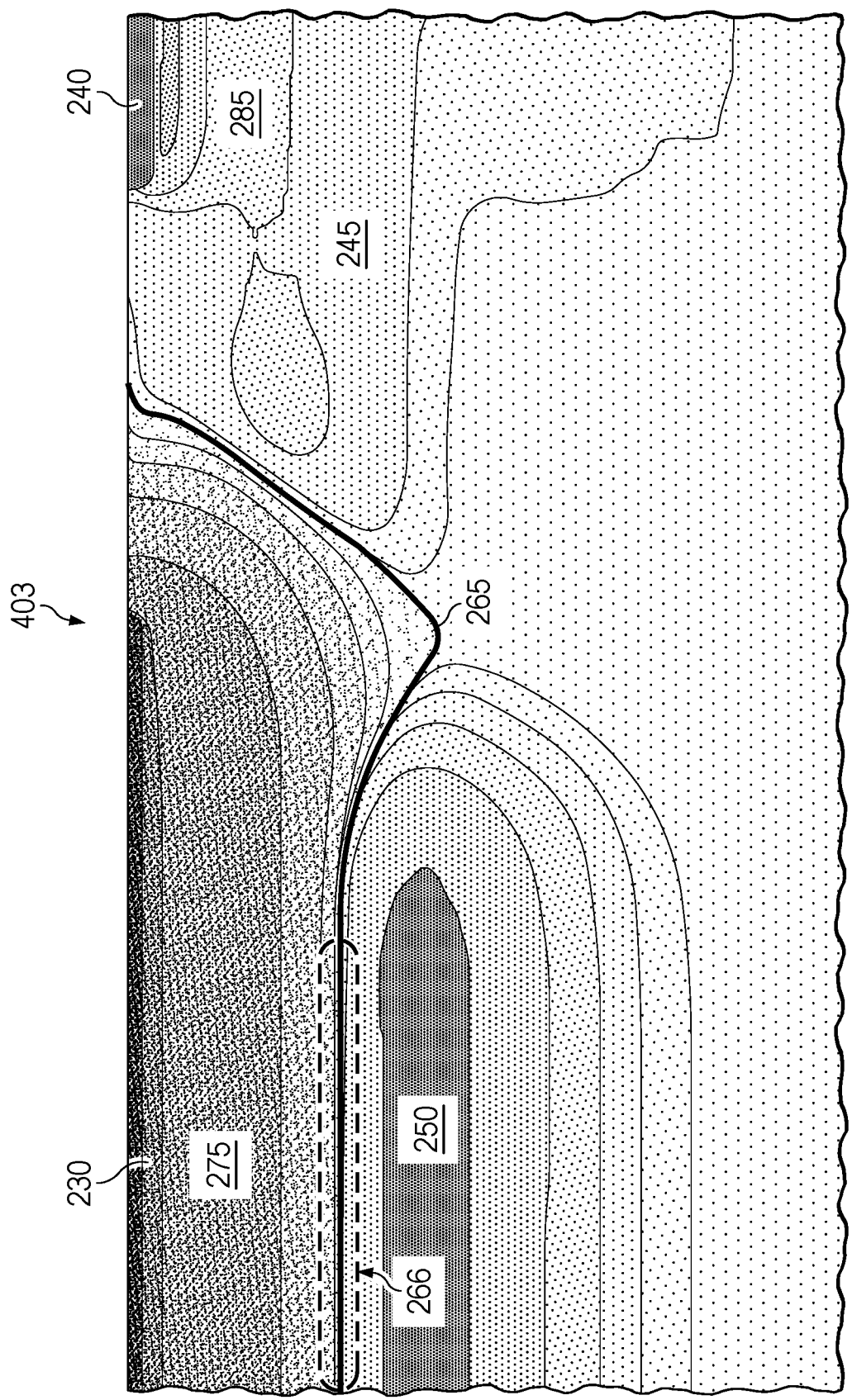

FIGS. 4A through 4C illustrate schematic 2D diagrams 401 through 403 of semiconductor devices (e.g., breakdown diode 200) in accordance with embodiments of the present disclosure. As with the 2D profile of net doping density of FIG. 2B, the diagrams 401 through 403 shows a portion of the semiconductor device 200 as marked in FIG. 2A.

Diagram 401 depicts the 2D profile of net doping density corresponding to Flow 2a where a common mask is used to have both the n-Zener implantation and the p-Zener implantation. As described above, although the as-implanted boron profile and phosphorus profile may have comparable (similar) lateral spread, the thermal drive cycles applied to both of the boron and phosphorus atoms (e.g., at step 345) are expected to result in greater lateral spread for the phosphorus atoms than the boron atoms. Accordingly, the footprint of the n-Zener region 275 includes the footprint of the p-Zener region 250 as shown in the diagram 401.

Diagram 402 depicts the 2D profile of net doping density corresponding to Flow 2b where two different masks are used for having the n-Zener implantation and the p-Zener implantation carried out respectively. As described above, the mask for the n-Zener implantation has an opening that is greater than the opening for the p-Zener implantation by 0.6 μm or more. In this manner, when the thermal drive cycles are completed driving both boron and phosphorus atoms, the footprint of the n-Zener region 275 includes the footprint of the p-Zener region 250 as shown in the diagram 402.

Diagram 403 depicts the 2D profile of net doping density corresponding to Flow 2c where two different masks are used for having the n-Zener implantation and the p-Zener implantation carried out respectively. The thermal drive cycles are done for the phosphorus atoms for forming the n-Zener region before having the p-Zener implantation. As described above, the mask for the n-Zener implantation has an opening that is greater than the opening for the p-Zener implantation by 0.6 µm or more. In this manner, when the boron atoms are implanted (and subsequently diffuse) to form the p-Zener region, the footprint of the n-Zener portion 275 includes the footprint of the p-Zener portion 250 as shown in the diagram 403. Moreover, the p-Zener region exhibits a relatively steeper boron profile (when compared to that of the p-Zener region of the diagram 402) in view of less thermal drive experienced by the boron atoms in Flow 2c.

While various embodiments of the present disclosure have been described above, it is to be understood that they have been presented by way of example and not limitation. Numerous changes to the disclosed embodiments can be made in accordance with the disclosure herein without departing from the spirit or scope of the present disclosure. For example, although examples described above with reference to FIGS. 1A-2B and 4A-4C include various doped portions (e.g., n-wells, p-wells, deep n-wells, n-Zener region, p-Zener region, n+ and p+ regions), in some embodiments, breakdown diodes can be fabricated by forming the various doped portions being opposite polarities—e.g., interchanging acceptor and donor dopant atoms. In addition, while in the illustrated embodiments various features or components have been shown as having particular arrangements or configurations, other arrangements and configurations are possible. Moreover, aspects of the present technology described in the context of example embodiments may be combined or eliminated in other embodiments. Thus, the breadth and scope of the present disclosure is not limited by any of the above described embodiments.

What is claimed is:

1. A semiconductor device, comprising:
a substrate with a surface;
a first electrode on the surface, the first electrode coupled to a p-doped region of the substrate, wherein the p-doped region includes:
a first portion coupled to the first electrode and has a first concentration of p-type dopants;
a second portion coupled to the first portion and has a second concentration of the p-type dopants less than the first concentration; and
a third portion coupled to the second portion and has a third concentration of the p-type dopants that is less than the first concentration and greater than the second concentration, the second portion extending to a greater depth within the substrate than the third portion; and
a second electrode on the surface, the second electrode coupled to an n-doped region of the substrate, wherein the p-doped region and the n-doped region form a pn junction configured to breakdown under a target reverse bias across the pn junction, the third portion of the p-doped region being adjacent to the pn junction.

2. The semiconductor device of claim 1, wherein the first portion is coupled to the second portion through a fourth portion of the p-doped region, wherein the fourth portion has a fourth concentration of the p-type dopants of less than the first concentration and greater than the second concentration.

3. The semiconductor device of claim 1, wherein:
the first portion is located at a first distance from the surface;
the second portion is located at a second distance from the surface greater than the first distance; and
the third portion is located at a third distance from the surface greater than the first distance.

4. The semiconductor device of claim 3, wherein the first portion is coupled to the second portion through a fourth portion of the p-doped region, wherein the fourth portion is located at a fourth distance from the surface greater than the first distance and less than the second distance.

5. The semiconductor device of claim 1, wherein the n-doped region includes a fourth portion coupled to the second electrode, a fifth portion coupled to the fourth portion, and a sixth portion coupled to the fifth portion, and wherein:
the fourth portion includes a first concentration of n-type dopants;
the fifth portion includes a second concentration of the n-type dopants less than the first concentration of the n-type dopants; and
the sixth portion includes a third concentration of the n-type dopants less than the first concentration and greater than the second concentration of the n-type dopants, the sixth portion being adjacent to the pn junction.

6. The semiconductor device of claim 1, wherein a footprint of the n-doped region encircles and at least partially overlaps a footprint of the p-doped region.

7. The semiconductor device of claim 1, wherein the pn junction encircles a footprint of the p-doped region.

8. The semiconductor device of claim 1, wherein the n-doped region includes a fourth portion coupled to the second electrode, a fifth portion coupled to the fourth portion, and a sixth portion coupled to the fifth portion, and wherein:
the fourth portion is located at a first distance from the surface;
the fifth portion is located at a second distance from the surface greater than the first distance; and
the sixth portion is located at a third distance from the surface greater than the second distance, wherein the sixth portion is adjacent to the pn junction.

9. The semiconductor device of claim 8, wherein:
the sixth portion is adjacent to the pn junction at a first side of the third portion; and
a second side of the sixth portion opposite the first side is adjacent to an isolation structure.

10. The semiconductor device of claim 9, wherein the pn junction is spaced apart from the isolation structure by at least 0.2 microns.

11. The semiconductor device of claim 9, wherein the isolation structure is a deep trench isolation structure that extends to a fourth distance from the surface, the fourth distance greater than the third distance.

12. The semiconductor device of claim 9, wherein the third sixth portion has a progressively decreasing concentration of n-type dopants along a direction from a sidewall of the isolation structure toward the pn junction in a plane parallel to the surface.

13. The semiconductor device of claim 1, wherein the n-doped region includes a fourth portion coupled to the second electrode and a fifth portion coupled to the fourth portion, and wherein:
the fourth portion includes a first concentration of n-type dopants; and the fifth portion includes a second concentration of the n-type dopants less than the first concentration of the n-type dopants, the fifth portion being adjacent to the pn junction.

14. The semiconductor device of claim 1, wherein a footprint of the p-doped region includes a footprint of the n-doped region.

15. The semiconductor device of claim 1, wherein the n-doped region includes a fourth portion coupled to the second electrode and a fifth portion coupled to the fourth portion, and wherein:
the fourth portion is located at a first distance from the surface; and
the fifth portion is located at a second distance from the surface greater than the first distance, wherein the fifth portion is adjacent to the pn junction.

16. The semiconductor device of claim 15, wherein a footprint of the second portion of the n-doped region includes the pn junction.

17. The semiconductor device of claim 1, wherein the pn junction is located below the surface by a distance equal to or greater than 1 micron.

18. The semiconductor device of claim 1, wherein the second portion of the p-doped region at least partially extends under the third portion of the p-doped region.

19. The semiconductor device of claim 1, wherein the third portion of the p-doped region has a side facing away from the surface and the second portion of the p-doped region interfaces with the side of the third portion of the p-doped region.

20. The semiconductor device of claim 1, wherein the third portion of the p-doped region extends continuously from under the first electrode to under the second electrode such that different parts of the third portion of the p-doped region are covered by the first and second electrodes.

21. The semiconductor device of claim 5, wherein the fifth portion of the n-doped region extends to a greater depth within the substrate than the third portion of the p-doped region.

22. The semiconductor device of claim 5, wherein the sixth portion of the n-doped region extends to a greater depth within the substrate than the third portion of the p-doped region.

23. The semiconductor device of claim 5, wherein the fifth portion of the n-doped region at least partially extends under the third portion of the p-doped region.

24. The semiconductor device of claim 5, wherein the sixth portion of the n-doped region at least partially extends under the third portion of the p-doped region.

25. The semiconductor device of claim 13, wherein the fifth portion of the n-doped region is disposed over and completely covers the third portion of the p-doped region.

26. The semiconductor device of claim 1, further comprising:
a silicide blocking layer disposed over and interfacing with the p-doped region and the n-doped region.

27. The semiconductor device of claim 13, further comprising:
a silicide blocking layer disposed over the n-doped region, wherein the fourth portion of the n-doped region interfaces with the silicide blocking layer.

28. The semiconductor device of claim 27, wherein the fifth portion of the n-doped region interfaces with the silicide blocking layer.

\* \* \* \* \*